(12) United States Patent
Matsudai et al.

(10) Patent No.: US 8,362,554 B2
(45) Date of Patent: Jan. 29, 2013

(54) MOSFET SEMICONDUCTOR DEVICE WITH BACKGATE LAYER AND REDUCED ON-RESISTANCE

(75) Inventors: Tomoko Matsudai, Tokyo (JP); Norio Yasuhara, Kanagawa-ken (JP); Takashi Tsurugai, Hyogo-ken (JP); Kumiko Sato, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 12/878,979

(22) Filed: Sep. 9, 2010

(65) Prior Publication Data

US 2011/0095369 A1    Apr. 28, 2011

(30) Foreign Application Priority Data

Oct. 23, 2009  (JP) ................................ 2009-244117

(51) Int. Cl.
*H01L 29/78*  (2006.01)
(52) U.S. Cl. ................. 257/336; 257/335; 257/E29.256
(58) Field of Classification Search .................. 257/335, 257/336, 401, E29.256
See application file for complete search history.

(56) References Cited

U.S. PATENT DOCUMENTS

| | | | |
|---|---|---|---|
| 2007/0040216 A1 | 2/2007 | Matsudai et al. | |
| 2008/0150016 A1* | 6/2008 | Ko | 257/330 |
| 2008/0237703 A1* | 10/2008 | Lin et al. | 257/336 |

FOREIGN PATENT DOCUMENTS

| | | | |
|---|---|---|---|
| JP | 2001-119019 | * | 4/2001 |
| JP | 2006-120818 | | 5/2006 |
| JP | 2007-081193 | | 3/2007 |

OTHER PUBLICATIONS

W. Huang et al., "5.5 V Zero-Channel Power MOSFETs with $R_{on,sp}$ of 1.0 mΩ•mm$^2$ for Portable Power Management Applications" ISPSD, Jun. 14-17, 2009.
Japanese Office Action dated May 23, 2011, Japanese Patent Application No. 2009-244117.

* cited by examiner

*Primary Examiner* — Jerome Jackson, Jr.
*Assistant Examiner* — Paul Budd
(74) *Attorney, Agent, or Firm* — Patterson & Sheridan, LLP

(57) ABSTRACT

According to one embodiment, a semiconductor device includes a drain region, a source region, a channel region, an insulating film, a gate electrode, a first semiconductor region, and
a second semiconductor region. The source region includes a source layer of the first conductivity type, a first back gate layer of the second conductivity type, and a second back gate layer of the second conductivity type. The first back gate layer is adjacent to the second semiconductor region on one side in a channel length direction, and is adjacent to the source layer on one other side in the channel length direction. The second back gate layer is adjacent to the source layer on the one side in the channel length direction, and is adjacent to the second semiconductor region on the one other side in the channel length direction.

6 Claims, 6 Drawing Sheets

MOSFET SEMICONDUCTOR DEVICE WITH BACKGATE LAYER AND REDUCED ON-RESISTANCE

CROSS-REFERENCE TO RELATED APPLICATION

This application is based upon and claims the benefit of priority from Japanese Patent Application No. 2009-244117, filed on Oct. 23, 2009; the entire contents of which are incorporated herein by reference.

FIELD

Embodiments described herein relate generally to a semiconductor device.

BACKGROUND

An on-resistance of lateral metal-oxide-semiconductor field effect transistors (MOSFETs) has recently been reduced through an improvement of device structure and a device miniaturization. Furthermore, there have also been various efforts to reduce an on-resistance per unit area (Ron·A) with the device miniaturization. The on-resistance is one of indicators of resistance reduction.

One of factors effective in reducing a device area of a MOSFET is a layout of a source layer and a back gate layer in a source region. In one known example structure, in plan view from above the device, the source layer and the back gate layer are laid out in parallel to a gate electrode in a longitudinal direction of the device. In this layout, an area of the source region is made larger, and incurs the increase of overall device area. On the other hand, in another example structure, the source layer and the back gate layer are arranged in a line along the gate electrode alternately, or regularly in a certain ratio.

The length of the source region in the channel length direction can be reduced in the layout of the source layer and the back gate layer arranged in a channel width direction alternately or under a certain rule. That is, a device length can be reduced.

However, the source region is absent along the gate electrode in the back gate layer with a simple alternate arrangement of the source layer and the back gate layer. Hence, an effective gate width (an effective gate length in the channel width direction) decreases. The on-resistance (Ron·A) increases because the effective gate width decreases. Thus, even if the length in the channel length direction can be reduced, reduction of the on-resistance (Ron·A) cannot be achieved.

Thus, the source layer and the back gate layer are preferably intermittently-arranged in the channel width direction to reduce the length in the channel length direction. Furthermore, there is demand for a layout which can sufficiently ensure the effective gate width.

DETAILED DESCRIPTION

In a structure in which a source layer and a back gate layer are discontinuously laid out in a channel width direction, a structure in which one end portion of the back gate layer in a channel length direction is in contact with a body well (a channel region) at a portion below a gate electrode is disclosed. However, the one end portion of the back gate layer extends to the channel region, and there is no region of the same conductivity type as the source layer between the channel region and the back gate layer. This results in increasing the on-resistance.

According to one embodiment, a semiconductor device includes a drain region of a first conductivity type, a source region, a channel region of a second conductivity type, an insulating film, a gate electrode, a first semiconductor region of the first conductivity type, and a second semiconductor region of the first conductivity type. The source region includes a source layer of the first conductivity type, a first back gate layer of the second conductivity type, and a second back gate layer of the second conductivity type. The first back gate layer is adjacent to the second semiconductor region on one side in a channel length direction, and is adjacent to the source layer on one other side in the channel length direction. The first back gate layer is electrically connected to an electrode in common with the source layer. The second back gate layer is adjacent to the source layer on the one side in the channel length direction, and is adjacent to the second semiconductor region on the one other side in the channel length direction. The second back gate layer is electrically connected to the electrode. The source region is spaced from the drain region. The channel region is provided between the drain region and the source region. The insulating film is provided on the channel region. The gate electrode is provided on the insulating film. The first semiconductor region is provided between the drain region and the channel region. The first semiconductor region has a lower first conductivity type impurity concentration than the drain region. The second semiconductor region is provided between the channel region and the source region. The second semiconductor region has a lower first conductivity type impurity concentration than the drain region.

Embodiments will now be described with reference to the drawings. In the following description of the embodiments, the first conductivity type is N-type, and the second conductivity type is P-type. However, the embodiments are also applicable to the case where the first conductivity type is P-type and the second conductivity type is N-type. Furthermore, although silicon is used as an example of the semiconductor, semiconductors other than silicon (e.g., compound semiconductors such as SiC and GaN) may also be used. In the case of silicon, a silicon-on-insulator (SOI) structure may also be used.

Figure 1:
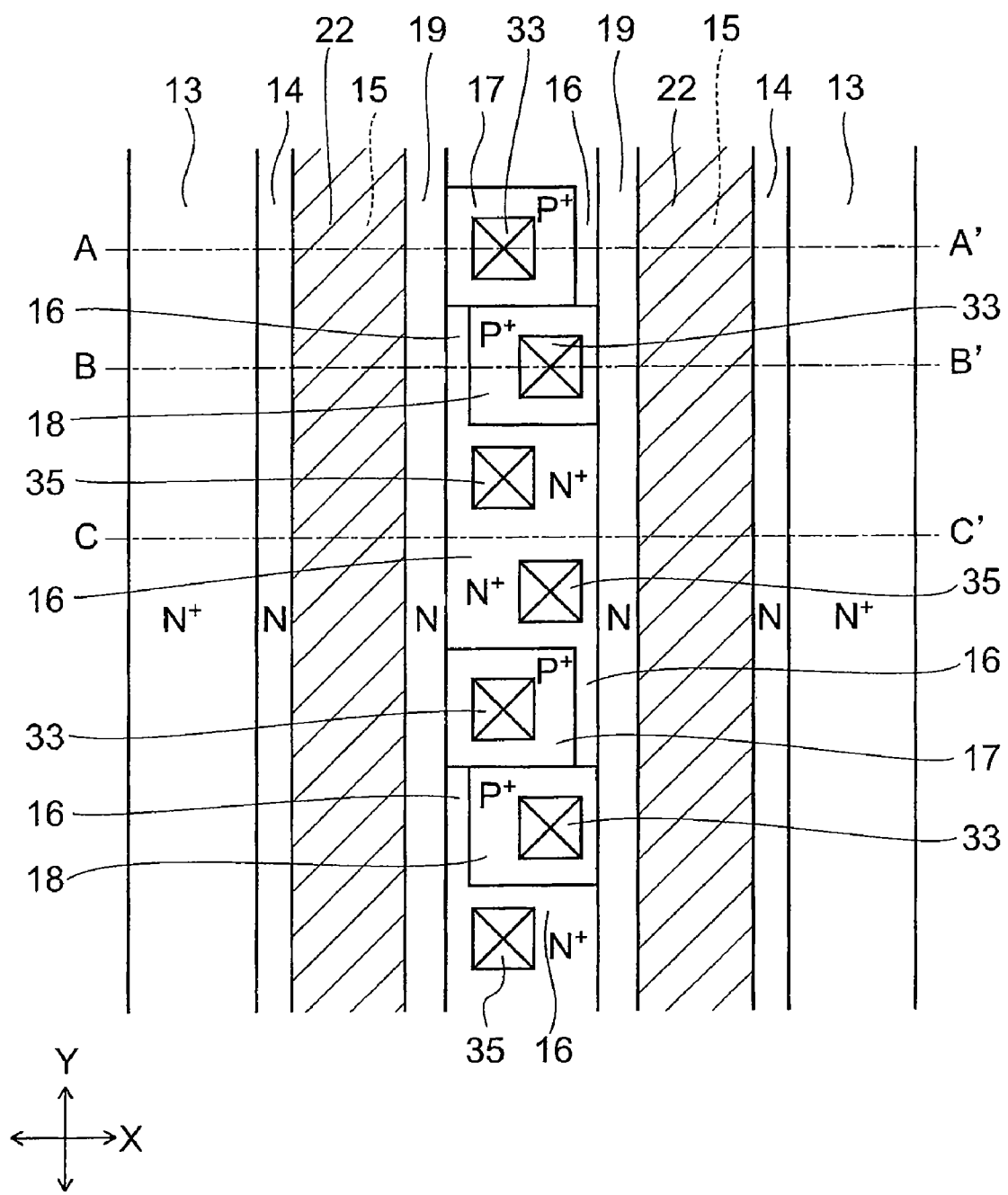
FIG. 1 is a schematic view showing a planar layout of major elements of a semiconductor device according to an embodiment.

FIG. 1 is a schematic view showing the planar layout of major elements in a semiconductor device according to an embodiment.

Figure 2A:
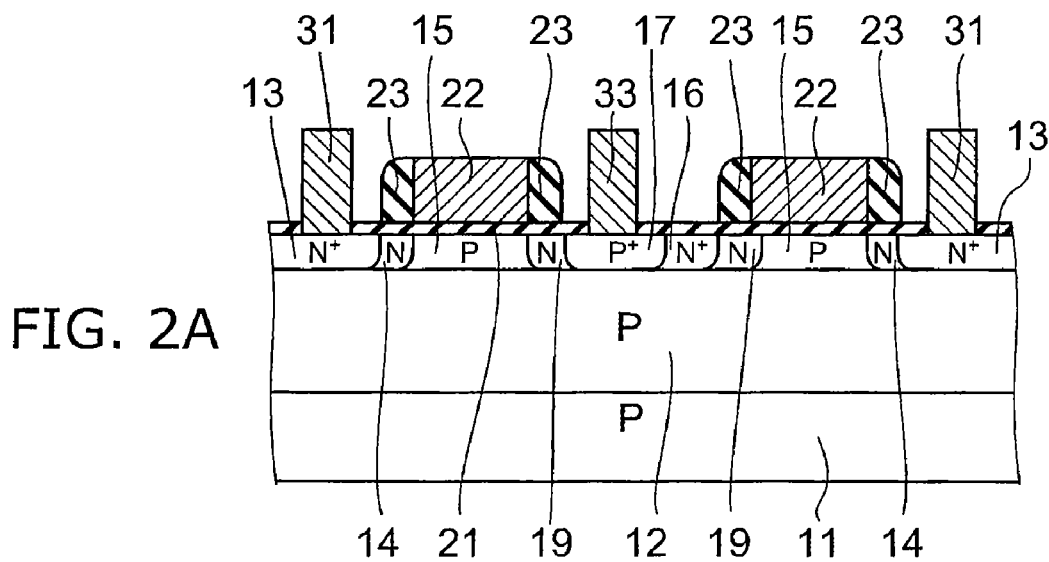
FIGS. 2A to 2C are schematic cross-sectional views of the semiconductor device.
Figure 2B:
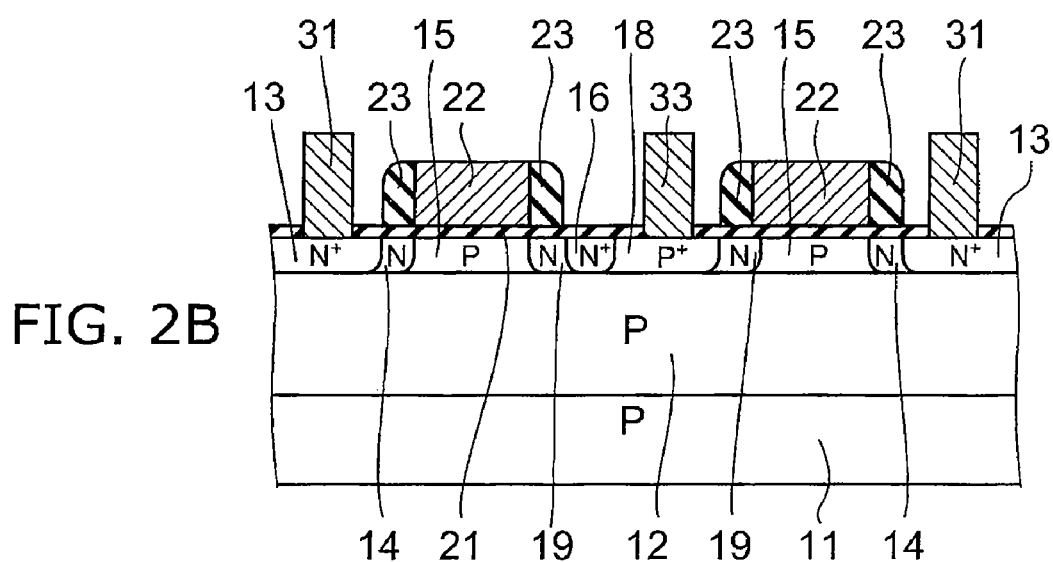
Figure 2C:
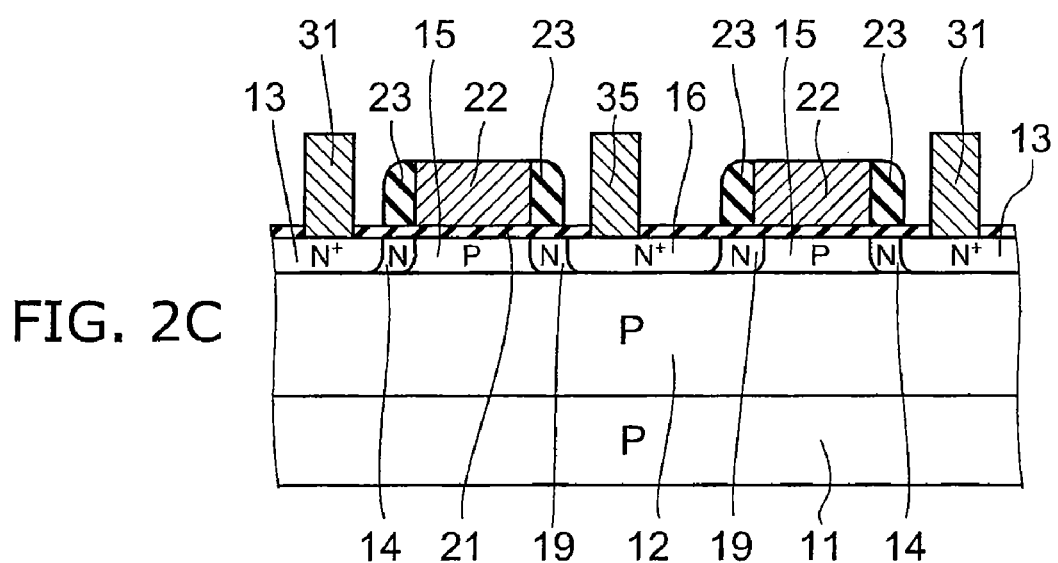

FIG. 2A is a schematic cross-sectional view corresponding to the A-A' cross section in FIG. 1. FIG. 2B is a schematic cross-sectional view corresponding to the B-B' cross section in FIG. 1. FIG. 2C is a schematic cross-sectional view corresponding to the C-C' cross section in FIG. 1.

The semiconductor device according to this embodiment is a lateral semiconductor device. In the lateral semiconductor device, the main current flows in the lateral direction connecting between the drain region and the source region formed in the substrate surface during gate turn-on.

The semiconductor device according to this embodiment includes an N$^+$-type drain region 13, an N-type lightly doped drain (LDD) region 14 as a first semiconductor region, a P-type channel region 15, a source region, an N-type semiconductor region 19 as a second semiconductor region, and a gate electrode 22. The source region includes an N$^+$-type source layer 16, P$^+$-type back gate layers 17 and 18. The LDD region 14 has a lower N-type impurity concentration than the drain region 13. The N-type semiconductor region 19 has a lower N-type impurity concentration than the drain region 13.

As shown in FIGS. 2A to 2C, a P-type semiconductor layer (or well) 12 is formed in the surface side of a P-type substrate 11. The drain region 13, the LDD region 14, the channel region 15, the N-type semiconductor region 19, the source layer 16, and the back gate layers 17 and 18 are selectively formed in the surface of the semiconductor layer 12.

An insulating film 21 is formed on the surface of these regions. The gate electrode 22 is provided via the insulating film 21 above the channel region 15.

In FIG. 1, the X direction is defined as the direction connecting between the drain region 13 and the source region. The X direction represents the channel length direction or the gate length direction. The Y direction orthogonal to the X direction represents the channel width direction or the gate width direction.

As shown in FIG. 1, the drain region 13 is formed in a striped planar pattern extending in the channel width direction. The LDD region 14 is formed in a striped planar pattern extending in the channel width direction. The N-type semiconductor region 19 is formed in a striped planar pattern extending in the channel width direction. The gate electrode 22 is formed in a striped planar pattern extending in the channel width direction. And the channel region 15 below the gate electrode 22 is formed in a striped planar pattern extending in the channel width direction.

A sidewall insulating film 23 is provided on the sidewall of the gate electrode 22 in the gate length direction. The LDD region 14 and the N-type semiconductor region 19 are located below the sidewall insulating film 23. The sidewall insulating film 23 is also formed in a striped planar pattern extending in the channel width direction.

The source layer 16 and the back gate layers 17 and 18 are selectively formed in the strip-shaped source region extending in the channel width direction. The LDD region 14, the channel region 15, and the N-type semiconductor region 19 are formed between the source region and the drain region 13.

The LDD region 14 is formed between the drain region 13 and the channel region 15. One end portion of the LDD region 14 in the channel length direction is adjacent to the drain region 13. The other end portion of the LDD region 14 in the channel length direction is adjacent to the channel region 15.

The channel region 15 is formed between the LDD region 14 and the N-type semiconductor region 19. One end portion of the channel region 15 in the channel length direction is adjacent to the LDD region 14. The other end portion of the channel region 15 in the channel length direction is adjacent to the N-type semiconductor region 19.

The back gate layer includes a first back gate layer 17 and a second back gate layer 18. The first back gate layer 17 and the second back gate layer 18 are selectively formed in the source region arranged between a pair of N-type semiconductor regions 19. The remaining portion in the source region is the source layer 16.

The region where the back gate layers 17 and 18 are formed, and the region where the back gate layers 17 and 18 are not formed but only the source layer 16 extends in the channel length direction and the channel width direction are discontinuously repeated in the channel width direction.

One end portion of the first back gate layer 17 in the channel length direction (left end portion in FIGS. 1 and 2A) is adjacent to the N-type semiconductor region 19. The other end portion of the first back gate layer 17 in the channel length direction (right end portion in FIGS. 1 and 2A) is adjacent to the source layer 16.

One end portion of the second back gate layer 18 in the channel length direction (left end portion in FIGS. 1 and 2B) is adjacent to the source layer 16. The other end portion of the second back gate layer 18 in the channel length direction (right end portion in FIGS. 1 and 2B) is adjacent to the N-type semiconductor region 19.

Each of the first back gate layer 17 and the second back gate layer 18 is adjacent to the source layer 16 only at one end portion in the channel length direction. The first back gate layer 17 is adjacent to the source layer 16 on one side (right side in FIG. 1) in the channel length direction. The second back gate layer 18 is adjacent to the source layer 16 on the other side (left side in FIG. 1). The other side is opposite to the one side (right side in FIG. 1) where the first back gate layer 17 is adjacent to the source layer 16.

The first back gate layer 17 and the second back gate layer 18 are alternately and repetitively laid out in the channel width direction. In the layout shown in FIG. 1, for instance, one first back gate layer 17 and one second back gate layer 18 are adjacent in the channel width direction.

The source layer 16 arranged between the first back gate layer 17 and the N-type semiconductor region 19 on the right side in FIG. 1, and the source layer 16 arranged between the second back gate layer 18 and the N-type semiconductor region 19 on the left side in FIG. 1, are alternately and repetitively laid out in the channel width direction.

A back gate contact electrode 33 is provided on the first back gate layer 17. The first back gate layer 17 is electrically connected to the back gate contact electrode 33. A back gate contact electrode 33 is provided on the second back gate layer 18. The second back gate layer 18 is electrically connected to the back gate contact electrode 33.

A source contact electrode 35 is provided on the region where only the source layer 16 extends in the channel length direction and the channel width direction. The source contact electrode 35 is electrically connected to the source layer 16.

A drain contact electrode 31 is provided on the drain region 13. The drain region 13 is electrically connected to the drain contact electrode 31.

An interlayer insulating layer, not shown, is provided on the insulating film 21 so as to cover the gate electrode 22 and the sidewall insulating film 23. A conductive material is buried in a contact hole penetrating through the interlayer insulating layer to each of the drain region 13, the back gate layers 17 and 18, and the source layer 16. Thus, each of the contact electrodes 31, 33, and 35 is formed.

The drain contact electrode 31 is connected to a drain electrode (first main electrode), not shown, provided on the interlayer insulating layer. The drain region 13 is electrically connected to the drain electrode through the drain contact electrode 31. Alternatively, the drain contact electrode 31 constitutes part of the drain electrode.

The source contact electrode 35 is connected to a source electrode (second main electrode), not shown, provided on the interlayer insulating layer. The source layer 16 is electrically connected to the source electrode through the source contact electrode 35. Alternatively, the source contact electrode 35 constitutes part of the source electrode.

The back gate contact electrode 33 is also connected to the source electrode. The back gate layers 17 and 18 are electrically connected to the source electrode through the back gate contact electrode 33. Alternatively, the back gate contact electrode 33 constitutes part of the source electrode.

The semiconductor layer 12 and the channel region 15 having the same conductivity type (P-type) as the back gate layers 17 and 18 are also electrically connected to the source electrode through the back gate contact electrode 33. Hence, the channel region 15 is made generally equipotential to the source layer 16. Thus, the operation of the parasitic bipolar transistor (an NPN bipolar transistor composed of the drain region 13, the channel region 15, and the source layer 16) is suppressed. This can prevent destruction due to excessive flow of current in the device.

In the semiconductor device according to the embodiment described above, with the drain electrode placed at a higher potential than the source electrode, the gate electrode 22 is applied with a desired control voltage. Then, an N-type channel (an inversion layer) is formed in the channel region 15 below the gate electrode 22. Hence, a drain current flows between the drain electrode and the source electrode through the drain region 13, the LDD region 14, the N-type channel, the N-type semiconductor region 19, and the source layer 16. Thus, the device is turned on.

Furthermore, when the drain electrode is placed at a higher potential than the source electrode, a reverse bias is applied to the PN junction between the N-type semiconductor (the drain region 13, the LDD region 14) and the P-type semiconductor (semiconductor layer 12, channel region 15). When avalanche breakdown occurs near the PN junction by the electric field applied to the PN junction, holes generated by the avalanche breakdown are ejected through the back gate layers 17 and 18 to the source electrode. Thus, device destruction due to avalanche breakdown can be prevented.

In this embodiment, the back gate layers 17 and 18 and the source layer 16 are discontinuously or selectively arranged in the channel width direction. This can suppress the increase of the length in the channel length direction of the overall source region including the back gate layers 17 and 18 and the source layer 16.

Furthermore, the region where the back gate layers 17 and 18 are laid out is not completely occupied by the back gate layers 17 and 18 as viewed in the channel length direction. The decrease of effective gate width can be suppressed by allowing the source layer 16 to exist also beside the back gate layers 17 and 18. Furthermore, the source layer 16 laterally adjacent to the back gate layers 17 and 18 is formed only on one side of each of the back gate layers 17 and 18 in the channel length direction. Thus, as compared with the case where the source layer 16 is formed on both sides in the channel length direction, the length in the channel length direction of the overall source region including the back gate layers 17 and 18 and the source layer 16 can be reduced.

That is, in this embodiment, the effective gate width can be sufficiently ensured while suppressing the expansion in the channel length direction of the overall source region including the back gate layers 17 and 18 and the source layer 16. Thus, the on-resistance per unit area can be reduced.

Furthermore, the LDD region 14 and the N-type semiconductor region 19 have a lower impurity concentration than the drain region 13 and the source layer 16. Thus, the LDD region 14 and the N-type semiconductor region 19 serve to enhance the avalanche withstand capability by relaxing the electric field applied to the insulating film 21 and the semiconductor region near the end portion of the gate electrode 22. In addition, the LDD region 14 and the N-type semiconductor region 19 serve as part of the current path during gate turn-on.

Here, a comparative example is described. The end portion of the back gate layers 17 and 18 is adjacent to not the source layer 16 but the channel region 15 in the comparative example. In this structure, there is a P-type region below the sidewall insulating film 23. Because the gate electrode 22 is not provided above the P-type region, no inversion layer is formed, or even if an inversion layer is formed, the on-resistance is higher.

In contrast, in this embodiment, the N-type semiconductor region 19 is formed between the channel region 15 and the end portion of the first back gate layer 17 not adjacent to the source layer 16. Thus, during gate turn-on, the N-type inversion layer formed in the channel region 15 is electrically connected to the source layer 16 through the N-type semiconductor region 19, so that the on-resistance of that path can be reduced. Near the junction interface between the N-type semiconductor region 19 and the first back gate layer 17, the current flows in the N-type semiconductor region 19 in the channel width direction. The current is then bypassed into the source layers 16 adjacent to the first back gate layer 17 in the channel width direction, and flows to the source electrode through the source contact electrode 35.

Similarly, the N-type semiconductor region 19 is formed between the channel region 15 and the end portion of the second back gate layer 18 not adjacent to the source layer 16. Thus, during gate turn-on, the N-type inversion layer formed in the channel region 15 is electrically connected to the source layer 16 through the N-type semiconductor region 19, so that the on-resistance of that path can be reduced. Near the junction interface between the N-type semiconductor region 19 and the second back gate layer 18, the current flows in the N-type semiconductor region 19 in the channel width direction. The current is then bypassed into the source layers 16 adjacent to the second back gate layer 18 in the channel width direction, and flows to the source electrode through the source contact electrode 35.

The semiconductor device according to this embodiment described above is suitable for applications such as power devices for power control, which require compatibility between low on-resistance and high avalanche withstand capability.

Next, a method for manufacturing the semiconductor device according to this embodiment is described with reference to FIGS. 3A to 3C.

Figure 3A:
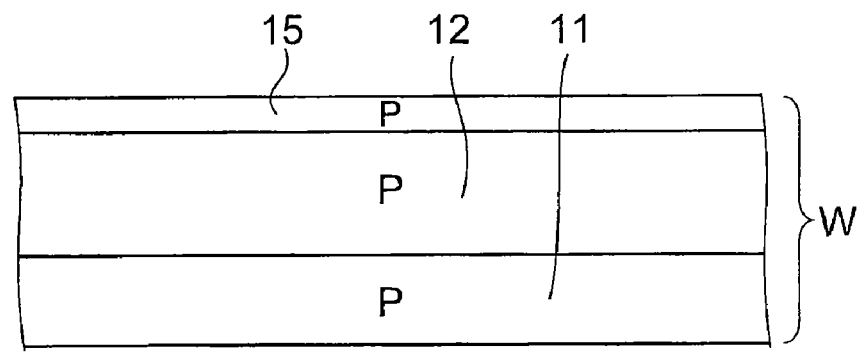
FIGS. 3A to 3C are schematic cross-sectional views showing a method for manufacturing the semiconductor device.

First, as shown in FIG. 3A, the P-type semiconductor layer 12 is formed in the surface side of the P-type substrate 11. Next, P-type impurity ions are implanted into the entire surface of the semiconductor layer 12, and heat treatment is performed. Thus, the P-type channel region 15 is formed in the surface of the semiconductor layer 12.

Figure 3B:
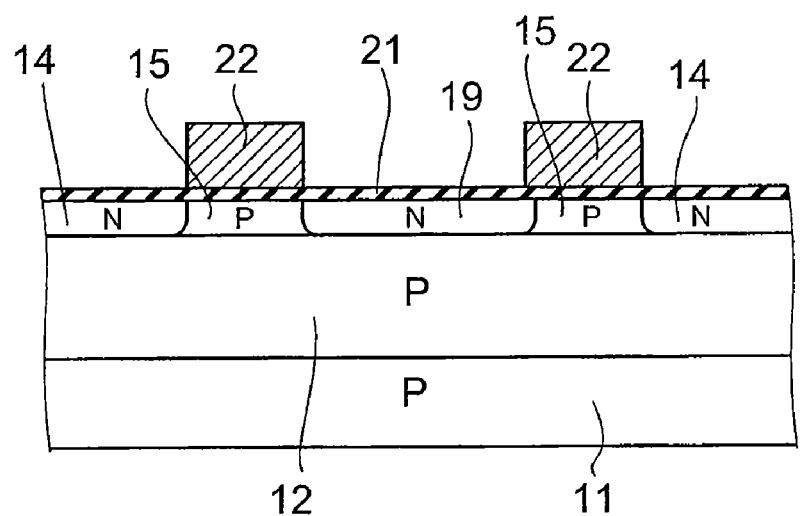

Next, the insulating film 21 is formed on the entire surface of the wafer W obtained by the above process as shown in FIG. 3B. Furthermore, a gate electrode material is formed on the insulating film 21. The gate electrode material is patterned and selectively left on the insulating film 21 to form the gate electrode 22. Subsequently, ion implantation of N-type impurity is performed to form the LDD region 14 and the N-type semiconductor region 19. The LDD region 14 and the N-type semiconductor region 19 are simultaneously formed in the same ion implantation process, and have generally the same N-type impurity concentration.

Figure 3C:
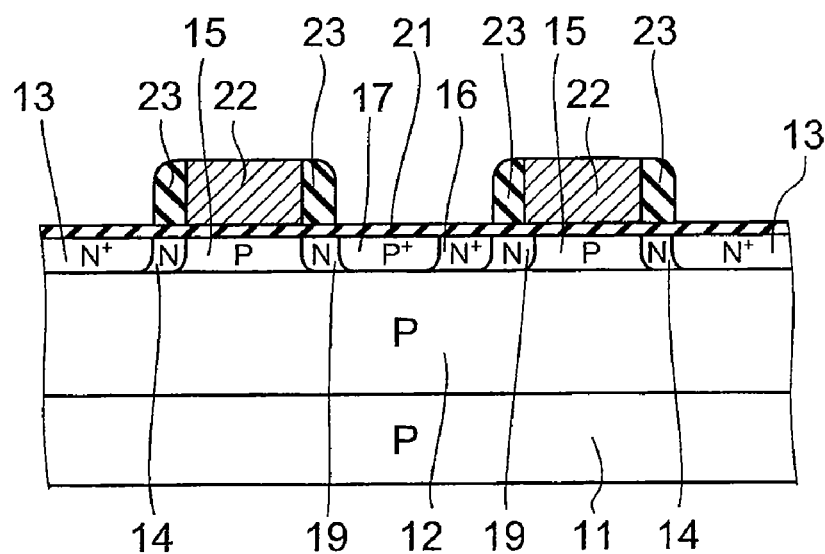

Next, as shown in FIG. 3C, sidewall insulating films 23 are formed on both side surfaces of the gate electrode 22 in the channel length direction. Subsequently, ion implantation of N-type impurity is performed to form the drain region 13 and the source layer 16. Furthermore, ion implantation of P-type impurity is performed to form the first back gate layer 17 and the second back gate layer 18. The drain region 13 and the source layer 16 are simultaneously formed in the same ion implantation process, and have generally the same N-type impurity concentration. The first back gate layer 17 and the second back gate layer 18 are simultaneously formed in the same ion implantation process, and have generally the same P-type impurity concentration.

Subsequently, an interlayer insulating layer, contact electrodes 31, 33, and 35, a drain electrode, and a source electrode are formed. The structure described above is a complementary metal-oxide-semiconductor (CMOS) structure in which the LDD region 14 and the N-type semiconductor region 19 have generally the same N-type impurity concentration.

Figure 4:
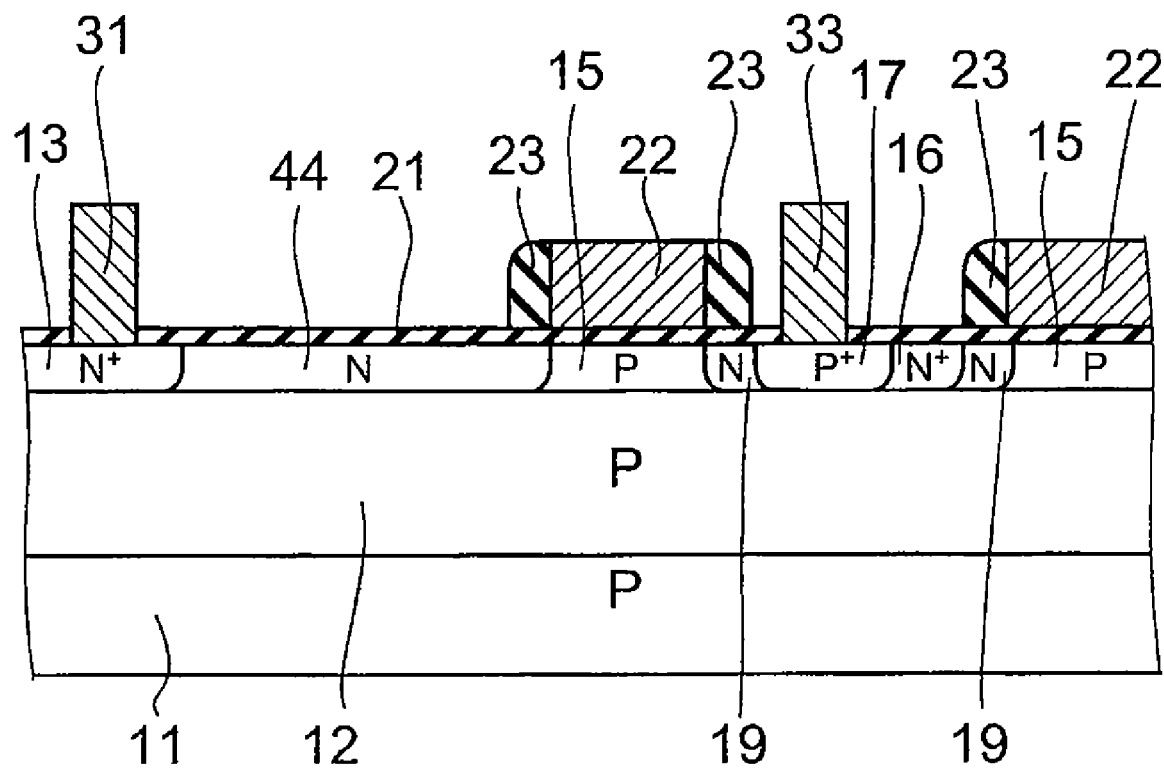
FIG. 4 is a schematic cross-sectional view showing another structure of a drain side portion of the semiconductor device according to the embodiment.

Next, FIG. 4 is a schematic cross-sectional view showing another example of the structure on the drain side. FIG. 4, just like FIG. 2A, corresponds to the cross section of the portion including the first back gate layer 17. The same elements as those in the above embodiment are labeled with like reference numerals.

In the structure shown in FIG. 4, a drift region 44 as a first semiconductor region is formed between the drain region 13 and the channel region 15. The drift region 44 is adjacent to the drain region 13 and the channel region 15. The drift region 44 has a lower N-type impurity concentration than the drain region 13, and has a longer length in the channel length direction than the N-type semiconductor region 19. The drift region 44 is formed in a planar layout extending like a strip in the channel width direction. An end portion of the drift region 44 at the channel region 15 side is located below the sidewall insulating film 23.

When a reverse bias is applied to the PN junction between the drift region 44 and the P-type semiconductor in contact with the drift region 44, the drift region 44 is depleted to relax the electric field and hold the device breakdown voltage. The N-type impurity concentration and the length in the channel length direction of the drift region 44 can be adjusted depending on the breakdown voltage required for the device. Thus, a desired breakdown voltage can be achieved.

Figure 5:
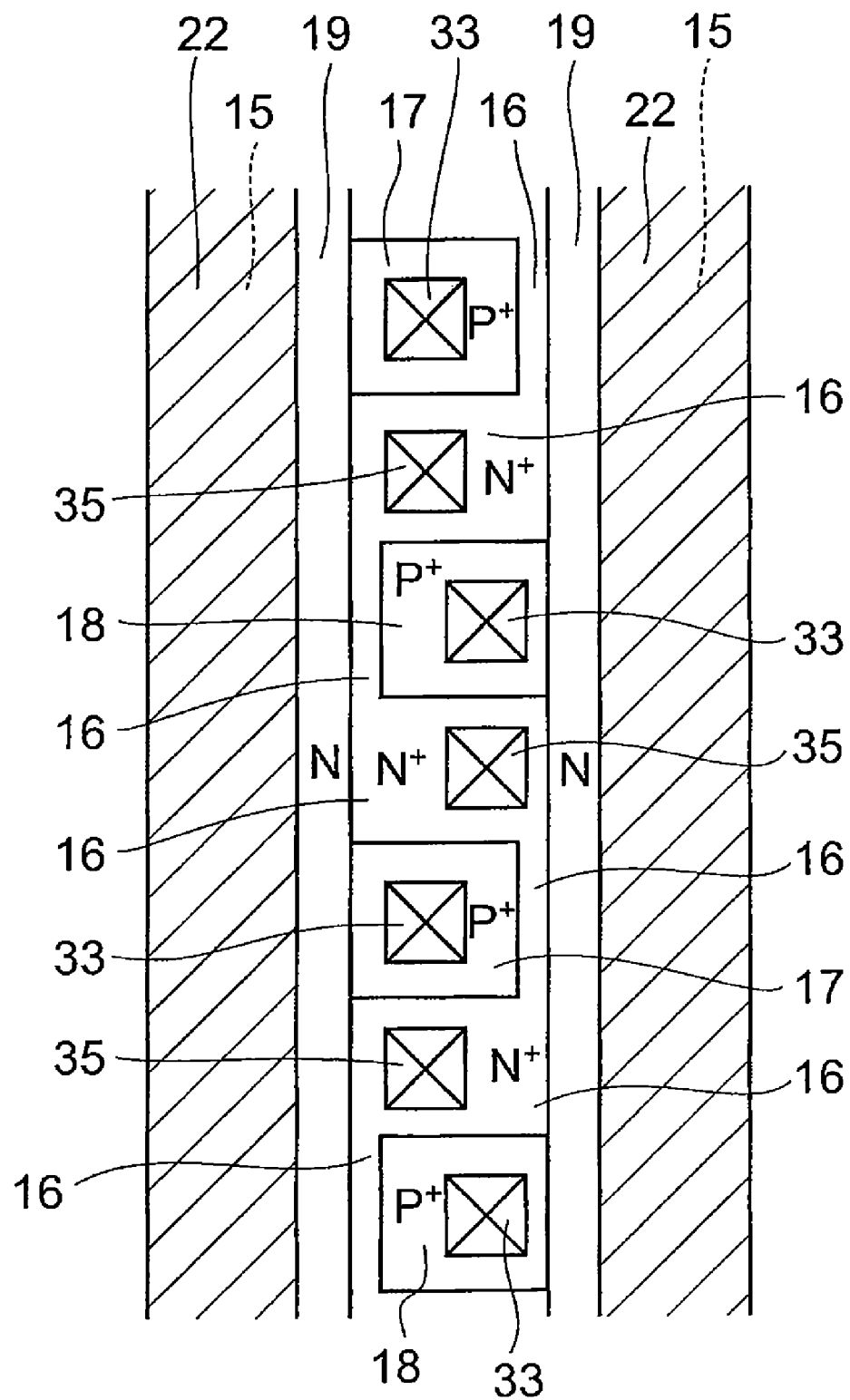
FIG. 5 is a schematic view showing another planar layout of a source layer and a back gate layer of the semiconductor device according to the embodiment.

FIG. 5 shows another example of the planar layout of the back gate layers 17 and 18 and the source layer 16. In FIG. 5, in contrast to FIG. 1, the first back gate layer 17 and the second back gate layer 18 are not adjacent in the channel width direction. The first back gate layer 17 and the second back gate layer 18 are alternately laid out in the channel width direction with the source layer 16 arranged between the first back gate layer 17 and the second back gate layer 18.

In both the layout of FIG. 1 and the layout of FIG. 5, the bypass path of the drain current to the source layer 16 near the junction interface between the N-type semiconductor region 19 and the back gate layers 17 and 18 only needs one first back gate layer 17 or one second back gate layer 18. Thus, the increase of the on-resistance of that path can be suppressed.

Figure 6:
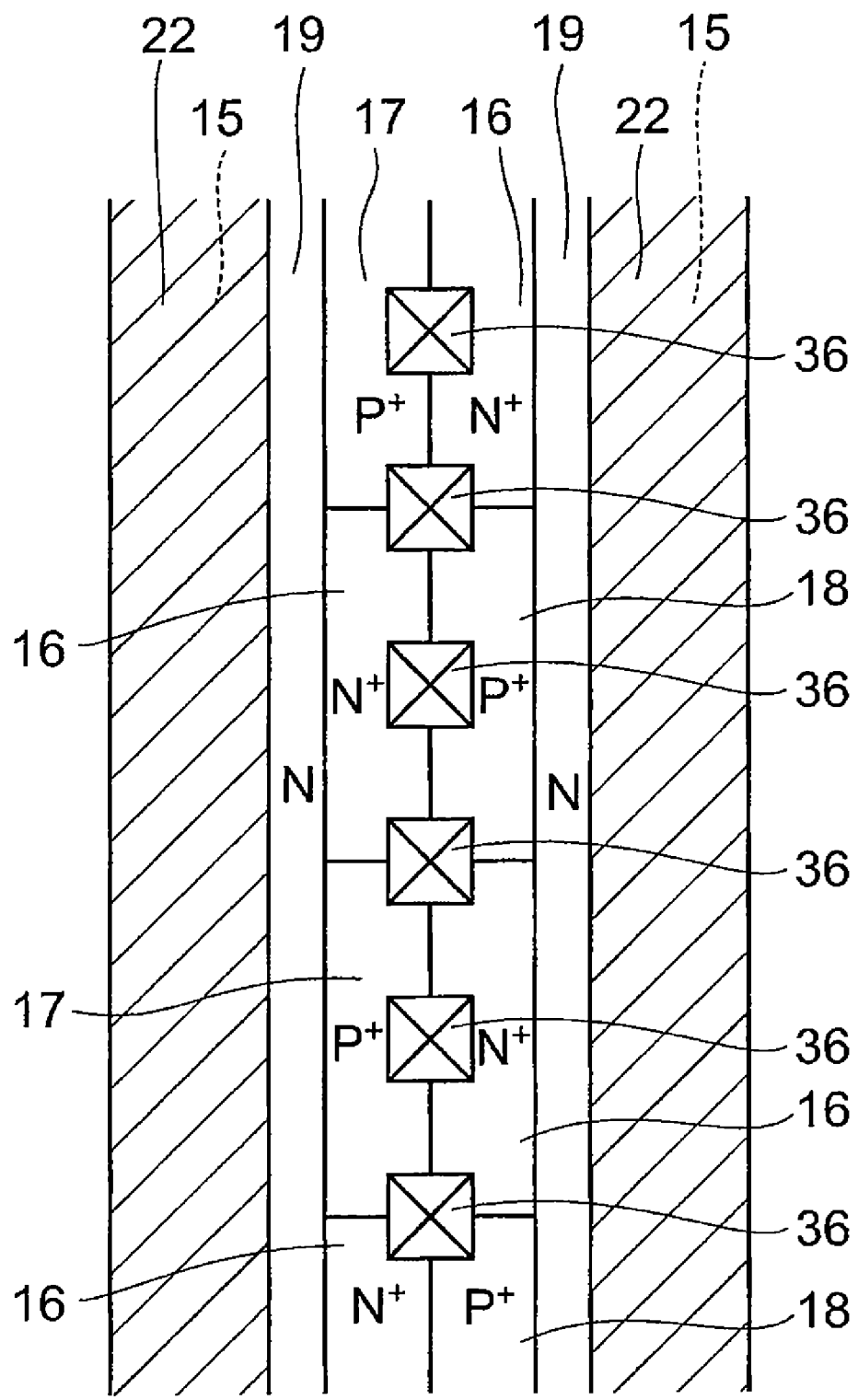
FIG. 6 is a schematic view showing still another planar layout of the source layer and the back gate layer of the semiconductor device according to the embodiment.

FIG. 6 shows still another example of the planar layout of the back gate layers 17 and 18 and the source layer 16. In this layout, the first back gate layer 17 and the source layer 16 adjacent to one side of the first back gate layer 17 have generally the same length in the channel length direction. Similarly, the second back gate layer 18 and the source layer 16 adjacent to one side of the second back gate layer 18 have generally the same length in the channel length direction.

A contact electrode 36 common to the first back gate layer 17 and the source layer 16 is provided on the junction interface between the first back gate layer 17 and the source layer 16. Similarly, a contact electrode 36 common to the second back gate layer 18 and the source layer 16 is provided on the junction interface between the second back gate layer 18 and the source layer 16. The first back gate layer 17, the second back gate layer 18, and the source layer 16 are electrically connected to a common source electrode through the contact electrode 36.

In any layout of FIGS. 1, 5, and 6, the first back gate layer 17 and the second back gate layer 18 are alternately laid out in the channel width direction. More specifically, the source layer 16 adjacent to one side of the first back gate layer 17, and the source layer 16 adjacent to one side of the second back gate layer 18, are not unevenly distributed on either side of a pair of gate electrodes 22 arranged in both sides of the back gate layers 17 and 18 and the source layer 16. Thus, current paths formed in both sides of the back gate layers 17 and 18 and the source layer 16 in the channel length direction can be evenly and effectively used.

It is noted that each element shown in FIGS. 1, 5, and 6 is repeated in the channel length direction at a prescribed pitch.

Embodiments are also applicable to a semiconductor device having a channel structure in which the channel region 15 is not in contact with the N-type semiconductor region 19.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The inventions claimed is:

1. A semiconductor device comprising:
a pair of drain regions of a first conductivity type;
a source region provided between the pair of drain regions, the source region being spaced apart from each of the drain regions;
a pair of channel regions of a second conductivity type, one of the channel regions being provided between one of the drain regions and the source region, and another of the channel regions being provided between another of the drain regions and the source region;
an insulating film provided on each of the channel regions;
a gate electrode provided on the insulating film;
a pair of first semiconductor regions of the first conductivity type having a lower first conductivity type impurity concentration than the drain regions, one of the first semiconductor regions being provided between said one of the drain regions and said one of the channel regions, and another of the first semiconductor regions being provided between said another of the drain regions and said another of the channel regions; and
a pair of second semiconductor regions of the first conductivity type having a lower first conductivity type impurity concentration than the drain regions, one of the second semiconductor regions being provided between said one of the channel regions and the source region, another of the second semiconductor regions being provided between said another of the channel regions and the source region, and each of the second semiconductor regions extending in a channel width direction, the source region extending in the channel width direction between the pair of second semiconductor regions, and including:

a first back gate layer of the second conductivity type that is adjacent to and in contact with said one of the second semiconductor regions on a first side of the source region in a channel length direction, not adjacent to and not in contact with said another of the second semiconductor regions on a second side of the source region in the channel length direction, and electrically connected to an electrode in common with the source region; and a second back gate layer of the second conductivity type that is adjacent to and in contact with said another of the second semiconductor regions on the second side of the source region in the channel length direction, not adjacent to and in contact with said one of the second semiconductor regions on the first side of the source region in the channel length direction, and electrically connected to the electrode in common with the source region, the first conductivity type impurity concentration in the second semiconductor regions being lower than the first conductivity type impurity concentration in the source region.

2. The device according to claim 1, wherein multiple pairs of the first back gate layer and the second back gate layer are discontinuously provided in a channel width direction.

3. The device according to claim 1, wherein the first back gate layer and the second back gate layer are alternately provided in a channel width direction.

4. The device according to claim 1, further comprising:

a sidewall insulating film provided on a sidewall of the gate electrode, the first semiconductor regions and the second semiconductor regions being provided below the sidewall insulating film.

5. The device according to claim 1, wherein the first semiconductor regions each have a longer length in the channel length direction than the second semiconductor regions.

6. The device according to claim 1, the source region further including:

a source layer of the first conductivity type, wherein a portion of the source layer adjacent to the first back gate layer and the second semiconductor regions, and a portion of the source layer adjacent to the second back gate layer and the second semiconductor regions are alternately repeated in a channel width direction.

* * * * *